United States Patent [19]

Hunt et al.

[11] 4,021,270
[45] May 3, 1977

[54] DOUBLE MASTER MASK PROCESS FOR INTEGRATED CIRCUIT MANUFACTURE

[75] Inventors: Merrill Roe Hunt, San Diego, Calif.; Christopher Angelos Ladas, Tempe; Sal Thomas Mastroianni, Mesa, both of Ariz.

[73] Assignee: Motorola, Inc., Chicago, Ill.

[22] Filed: June 28, 1976

[21] Appl. No.: 700,432

[52] U.S. Cl. .................................. 148/1.5; 148/187
[51] Int. Cl.² ........................................ H01L 21/265
[58] Field of Search ............................. 148/1.5, 187

[56] References Cited
UNITED STATES PATENTS

| | | | |
|---|---|---|---|
| 3,673,679 | 7/1972 | Carbajal et al. | 148/187 UX |
| 3,771,218 | 11/1973 | Langdon | 148/187 |
| 3,793,088 | 2/1974 | Eckton, Jr. et al. | 148/1.5 |
| 3,865,652 | 2/1975 | Agusta et al. | 148/187 |

*Primary Examiner*—L. Dewayne Rutledge
*Assistant Examiner*—J. M. Davis
*Attorney, Agent, or Firm*—Robert A. Farley

[57] ABSTRACT

A double master mask process for fabricating semiconductor integrated circuits is provided in which selectively etchable dielectric layers and ion implanted resistors are used to form dense integrated circuits with a minimum number of critical alignments. A first silicon dioxide silicon nitride layer used in conjunction with a first master photomask defines a base region and an isolation region which are self-aligned with respect to each other and with respect to resistor contact regions. After isolation and base diffusion, the first oxide/nitride layer is stripped away and a second oxide/nitride layer is grown. Using a photoresist mask, a predeposition layer for the resistor is then formed using ion implantation through the oxide/nitride layers. A second master photomask allows the formation of collector and emitter regions and base and resistor contact which are self-aligned with respect to each other. The diffusion cycle used to form the collector contact and emitter regions simultaneously anneals the ion implanted resistor region to form a high value resistor of closely controlled tolerances. In conjunction with the use of the first master mask, a base region and isolation region which are self-aligned with respect to each other are formed through the use of a "base washout" process which maintains self-alignment without the use of additional process steps.

16 Claims, 9 Drawing Figures

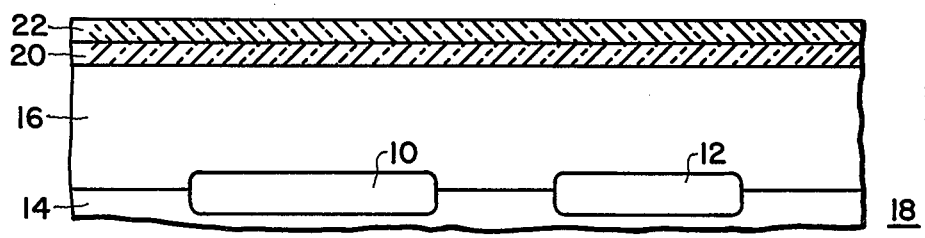
FIG. 1
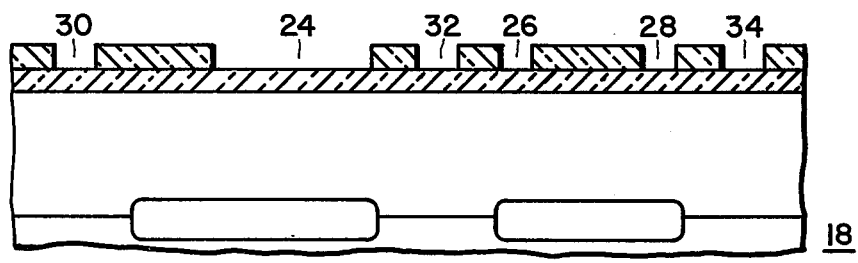
FIG. 2
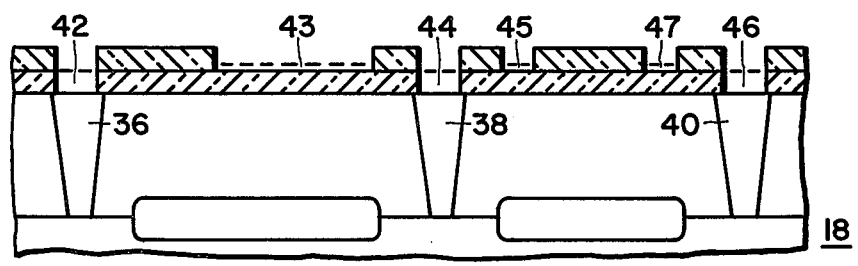
FIG. 3
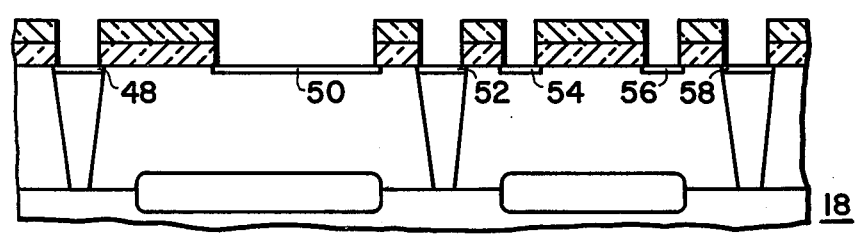
FIG. 4
FIG. 5
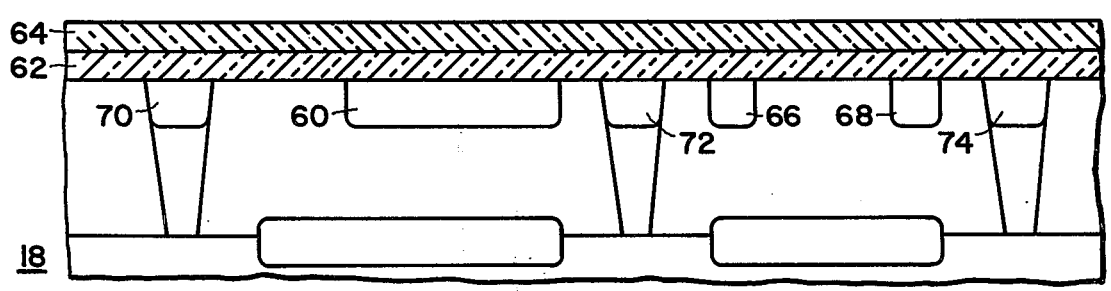

DOUBLE MASTER MASK PROCESS FOR INTEGRATED CIRCUIT MANUFACTURE

BACKGROUND OF THE INVENTION

The present invention pertains in general to the fabrication of semiconductor devices and, in particular, to self-aligned methods for manufacturing high density integrated circuits.

A recent advance in fabricating high density integrated circuits is the use of self-aligning techniques. These techniques use selectively etchable thin layers with openings in one layer forming the etching mask for openings in subsequent layers to form a given device region. In addition to the fundamental device region registration advantages offered by self-alignment, the use of multiple dielectric layers in a selective etching technique offers inherent protection against device defects caused by mask scars or pinholes. This pinhole protection derives from the fact that any pinholes in the upper dielectric layer caused by defects in the master mask will be covered by photoresists in the steps used to selectively "enable" selected groups of master mask openings in subsequent process steps.

In prior art process for fabricating transistors, multiple dielectric layers and selective etching have been used in conjunction with a single master mask to form collector contact, base contact and emitter regions which are self-aligned with respect to each other. These processes require preliminary masking steps to provide the required registration of isolation and buried layer regions, base and isolation regions and when required, the registration of a deep collector contact within the isolation region. With the advent of higher density integrated circuits and, in particular, with large memory and microprocessor integrated circuits having a large number of closely spaced devices, the registration of base and isolation regions becomes extremely critical. The yields of these type integrated circuits manufactured using prior art processes have suffered because this registration problem is not addressed. The yields of large, high density integrated circuits manufactured using prior art processes are also adversely affected by the fact that the pinhole protection inherent in self-alignment techniques is unavailable to preliminary masking steps and by the fact that the sequence of selective diffusion and reoxidation process steps required by a single master mask create additional dielectric layer transitions or "steps" across the upper surface of the integrated circuit. The loss of planarity associated with these steps makes it difficult to obtain reliable interconnecting metal patterns, especially in multilevel metallization systems.

SUMMARY OF THE INVENTION

Accordingly, it is an object of this invention to provide an improved self-aligned method for fabricating semiconductor integrated circuits using selectively etchable multiple dielectric layers.

It is a further object of this invention to provide an improved method of manufacturing semiconductor integrated circuits in which the number of critical device registrations required is reduced by using a first master mask to form self-aligned base and isolation regions and a second master mask to form self-aligned collector contact, base contact and emitter regions.

It is a further object of this invention to provide an improved method of manufacturing semiconductor integrated circuits in which the formation of base and isolation regions through the use of selectively etchable multiple dielectric layers improves yields by eliminating mask induced defects in these regions.

It is a further object of this invention to provide an improved method of manufacturing semiconductor integrated circuits in which ion implantation is used subsequent to a first master mask to form shallow device regions which encompass the self-aligned device regions defined by the first master mask.

It is a further object of this invention to provide an improved method of manufacturing semiconductor integrated circuits in which the removal of the selectively etchable multiple dielectric layers used to form isolation and base regions subsequent to forming the remaining device regions, results in an improved surface planarity of the completed integrated circuit.

It is a further object of this invention to provide an improved method of manufacturing semiconductor integrated circuits in which the process sequence is simplified by using a maskless etch to simultaneously define isolation, base, and resistor contact regions.

Briefly described, the present invention is an improved method for manufacturing semiconductor integrated circuits wherein the diffusion of impurities through a predetermined pattern of openings in a first selectively etchable masking layer forms a first group of self-aligned device regions, ion implantation independent of the predetermined pattern of openings forms additional device regions and further diffusion of impurities through a predetermined pattern of openings in a second selectively etchable masking layer, formed subsequent to the removal of the first selectively etchable masking layer, forms a second group of self-aligned device regions.

DESCRIPTION OF THE DRAWINGS

FIG. 1 through FIG. 9 show cross sectional views of a semiconductor substrate at various stages of the manufacturing method of the present invention.

DETAILED DESCRIPTION

Figure 6:
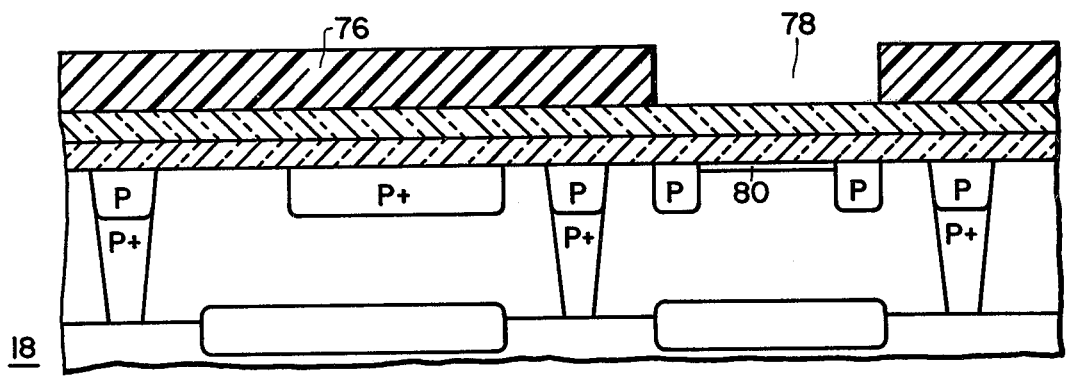

The self-aligned method of integrated circuit fabrication of the present invention will now be described in terms of the detailed fabrication steps used to manufacture the preferred embodiment together with the attached figures which show the structure of the integrated circuit devices being fabricated at various stages in the process. To simplify the discussion, conventional process steps will be described only briefly, while those steps relating to the novel aspects of the process will be described in greater detail.

Initially, as shown in FIG. 1 and using conventional techniques, N+ buried layers 10 and 12 are formed in a P-type semiconductor body 14 by diffusing an arsenic impurity into the semiconductor body 12 and thereafter growing a thin N-type epitaxial silicon layer 16 (typically 0.3 ohm-centimeter resistivity, 3 microns thick) to obtain the resulting substrate 18. The surface of substrate 18 is then coated with approximately 2,500 A of thermally grown silicon dioxide to form layer 20 and then a silicon nitride layer 22 approximately 1,500 A thick is deposited over the surface of layer 20. This procedure provides selectively etchable layers over the surface of substrate 18 which will be used in subsequent process steps.

In the steps of FIG. 2, a single photomask and conventional photoresist and etching techniques are used to form in a single step a predetermined pattern of openings which are later employed for forming device regions. Opening 24 defines a base region, openings 26 and 28 define resistor preohmic contact regions and openings 30, 32 and 34 define isolation regions. Openings 30 and 32 are two portions of the same annular ring isolation region delineating the collector of a transistor. Because the openings in layer 22 have been formed using a single photomask in a single step, layer 22 provides a first master masking layer which allows the fabrication of device regions which are self aligned with respect to each other as will be evident by the subsequent process steps of the invention.

In the steps of FIG. 3, conventional photoresist techniques and an "oversize" photomask, which has non-critical alignment, are used such that the surface of silicon dioxide layer 20 is exposed in isolation openings 30, 32 and 34 while the remaining openings in layer 22 remain covered with photoresist. This procedure allows the selective etching of the silicon dioxide such that the silicon surface of substrate 18 is exposed only at those locations where an isolation diffusion is to be performed. Using conventional techniques, a P-type impurity is now diffused through openings 30, 32 and 34 to form isolation regions 36, 38 and 40 which extend downward to contact P-type semiconductor body 14. Simultaneous with the diffusion cycle used to form isolation regions 36, 38 and 40, a re-oxidation cycle forms silicon dioxide regions 42, 44 and 46 which reestablishes the silicon dioxide layer over the surface of silicon epitaxial layer 16. Regions 42, 44 and 46 prevent undercutting of silicon dioxide layer 20 during the subsequent "base washout" etching step described below. The re-oxidation cycle also results in the growth of a small amount of additional silicon dioxide over the surface of silicon dioxide layer 20 in base opening 24 and resistor preohmic openings 26 and 28 as illustrated by regions 43, 45 and 47 in FIG. 3.

In the process steps of FIG. 4, a maskless etch is used such that the silicon dioxide regions underlying openings 24, 26, 28, 30, 32 and 34 of silicon nitride layer 22 are all removed to expose the surface of epitaxial layer 16. A base predeposition is then applied in all openings using a boron doped oxide which is deposited in a furnace tube at about 900° C such that the dopant enters the surface of epitaxial silicon layer 16 to a depth of approximately 1000 A thereby creating regions 48, 50, 52, 54, 56 and 58. This process step wherein the base region of a device is formed by a "base washout" process which does not require a photoresist or masking step provides a key advantage in the process of the present invention.

In the process steps of FIG. 5, the boron doped predeposition of oxide of process step 4, the silicon nitride layer 22 and the silicon dioxide layer 20 are completely removed from the surface of substrate 18. The removal of silicon nitride layer 22 and silicon dioxide layer 20 thus removes the first master mask layer which was used to define device regions in the previous process steps. Substrate 18 is then placed in a base diffusion furnace at a temperature of from 900° C to 1050° C causing the boron doped surface regions 48, 50, 52, 54, 56 and 58 (FIG. 4) to diffuse downward into silicon epitaxial layer 16. The prior base predeposition cycle and the base diffusion cycle are designed to produce a base region 60 having a thickness of approximately one micron and having the required resistivity simultaneously with the growth of a silicon dioxide layer 62 approximately 2000A thick. Silicon dioxide layer 62 and the subsequently deposited silicon nitride layer 64 (approximately 2000 A thick) form the composite layers required for the second master masking steps of the remainder of the process. An advantageous feature of the present invention is the process simplicity which results from designing the base diffusion cycle such that the formation of base region 60 having the required thickness and resistivity can occur simultaneous with the formation of silicon dioxide layer 62. Because of the "base washout" process steps previously discussed in conjunction with FIG. 4, the base diffusion cycle causes the formation of diffused resistor contact regions 66 and 68 and diffused overlay regions 70, 72 and 74. Resistor contact regions 66 and 68 provide regions of high dopant concentration required for good ohmic contact to the resistor which will subsequently be formed between them. The diffused overlay regions 70, 72 and 74 associated respectively to previously formed isolation regions 36, 38 and 40 are not required but are simply a non-detrimental effect resulting from the use of the much simpler base washout process step previously described for FIG. 4.

The process steps of FIG. 6 illustrate the formation of a high value resistor using ion implantation. A photoresist layer 76 is applied over the surface of substrate 18, a resistor photomask is applied and exposed and the photoresist layer developed to form opening 78 which defines a region connecting previously diffused resistor contact regions 66 and 68. A source of high energy ions is now applied. Photoresist layer 76 inhibits the passage of these ions except through opening 78 where ions pass through silicon nitride layer 64 and silicon dioxide layer 62 to form a thin boron doped layer at the surface of epitaxial silicon layer 16. A key feature of this process step is the fact that although a photoresist step is required, the ion implantation is done through the oxide-nitride composite layer and thus no etching step is required to dope the silicon surface to provide for the formation of a resistor. It is also important to notice that the high resistance ion implanted resistor region 80 is very thin at this process step (less than 1000A). The final depth of the resistor region will be formed in the later emitter diffusion process step discussed below.

Figure 7:
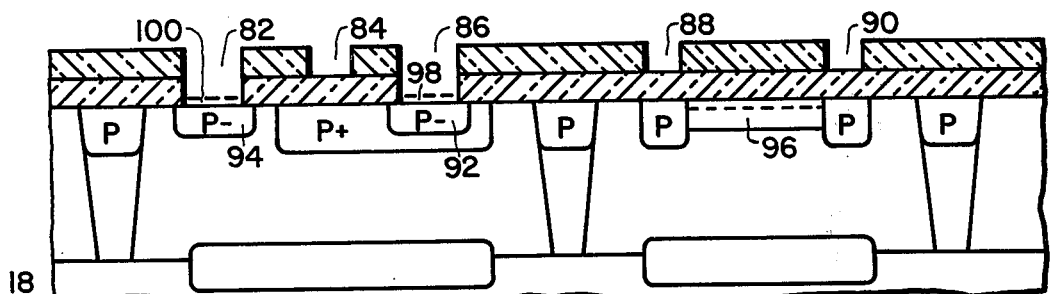

In the process step of FIG. 7, using conventional photoresist and nitride etch techniques, a photomask is used to create a second set of master mask openings. These include collector contact opening 82, base contact opening 84, emitter opening 86 and resistor contact openings 88 and 90. Next, the upper surfaces are once again coated with photoresist and an oversized photomask is used so that only collector contact opening 82 and emitter contact opening 86 are exposed and an oxide etch can be used to selectively remove only portions of silicon dioxide layer 62 underlying these openings. The photoresist layer is removed and substrate 18 is placed in the diffusion furnace where an emitter diffusion cycle is used to form emitter region 92 which is about 0.7 microns deep and simultaneously to form collector contact region 94. During the emitter diffusion cycle, the thin boron doped resistor region 80 previously formed by ion implantation is "annealed" such that the boron dopant diffuses downward to form a resistor region 96 which is approximately 5000A thick. The emitter diffusion cycle of this process step includes incidental reoxidation whereby relatively thin silicon dioxide layers 98 and 100, (approximately 200A thick) are grown over the top of emitter region 98 and collector contact region 94 simultaneous with the diffusion. These oxide layers will subsequently be etched away in the "washout" emitter process used to form the emitter contact prior to metallization, as described below.

Figure 8:
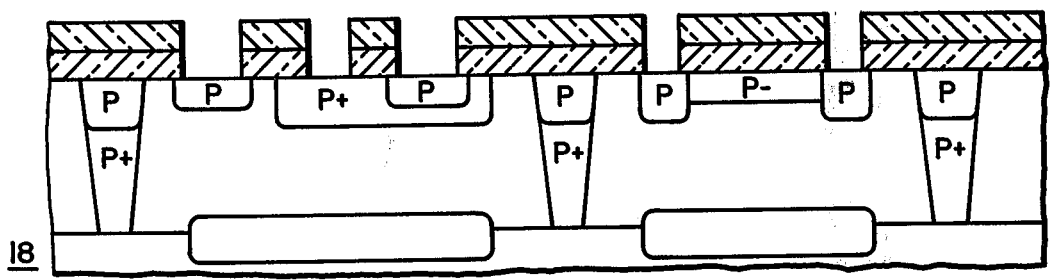

In the process steps of FIG. 8, photoresist and an oversized photomask are used to expose base contact opening 84 and resistor preohmic contact openings 88 and 90 of an oxide etch is used to selectively etch the portions of silicon dioxide layer 62 underlying these openings. After the photoresist is stripped away, an emitter washout process is used to etch away the thin silicon dioxide layers 98 and 100. Collector, base, emitter, and resistor contact regions are thus all cleared of oxide and ready for metal contact as formed in subsequent metallization process steps.

Figure 9:
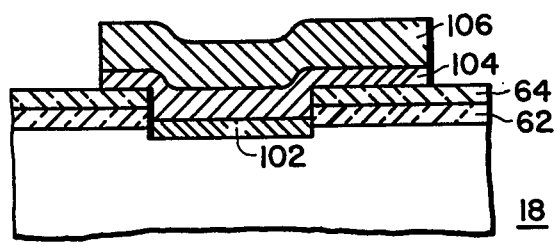

FIG. 9 illustrates one particular metallization system that can be advantageously used with the process of the present invention. To form this metallization system, a layer of platinum is deposited over the surface of substrate 18 and into the silicon contact openings which have been cut through silicon dioxide layer 62 and silicon nitride layer 64 by the process previously described. The deposition of platinum is followed by a heat treatment at 400° to 650° C causing silicon to migrate into the overlying platinum layer to form a platinum silicide region 102 in each of the contact openings. The platinum layer is stripped away and the substrate is returned to a metal deposition system where a layer of refractory metal 104 which may be tungsten, titanium, molybdenum or suitable alloys thereof, and an additional layer of aluminum 106 are deposited. Using conventional photoresist and metal etch techniques, a metal photomask is used to delineate a metal interconnection pattern.

The metallization system of FIG. 9 is particularly useful because the formation of platinum silicide regions in all contact openings in conjunction with a barrier metal region of refractory metal effectively seals the substrate surface against the effects of further processing. If a processing problem occurs from this point on, the surface of the substrate can be completely stripped back, leaving the tungsten or titanium and silicon nitride surfaces uneffected. This is possible because the etchants used for subsequent photoresist applications are phosphoric acid or hydrofluoric acid based etchants which have little effect on the refractory metal barrier or on the silicon nitride. This rework capability is particularly useful in complex integrated circuit applications and in particular in integrated circuits which make use of multiple level metal interconnections.

The process sequence of FIGS. 1–9 described above illustrates a particular embodiment of the present invention which combines the self-alignment and pinhole protection advantages of a first and a second master mask, the process simplification of base washout and the inherent doping level control of ion implantation. The process thus allows the fabrication of complex integrated circuit structure having high value resistors with closely controlled tolerances. The process allows fabrication of load resistors with resistivities as high as several thousand ohms per square and tolerances as small as ±5%. In memory integrated circuits, high value resistors with closely controlled tolerances allow the design of memory cells requiring a much smaller layout area on the chip. The inherent yield advantages resulting from the present invention process combined with its high value resistor capability thus allow the manufacture of larger memories requiring less total chip area and which are thus cheaper to manufacture.

In addition to the particular embodiment of the present invention illustrated above for high value resistors, alternative embodiments for low value resistors are also possible. In one embodiment, useful for resistor structures requiring resistivities in the range 300 ohms per square to 700 ohms per square, the process sequence above is modified by opening resistor regions during the base washout portion of the process. Diffused resistor regions of the required resistivity are then formed simultaneously with the diffusion of the deeper base regions. In a further embodiment, a shallower base enhancement diffusion overlays the deeper base diffusion to further lower resistivity. A feature of this embodiment of the invention is the fact that since the resistor junctions are formed using a base diffusion, they have a lower grade constant which tends to reduce capacitance.

A convenient summarization of the advantages of the present invention which derive from the use of a first master mask (1st MM) and a second master mask (2nd MM) is provided by Table I which compares the mask alignment steps of a conventional process to those required by the process of the present invention. As shown in the Table, the total number of critical alignments required has been reduced by 50% and one alignment has been eliminated through the use of the base washout process step.

TABLE I

| COMPARISON OF ALIGNMENT STEPS | | | |
|---|---|---|---|
| CONVENTIONAL | | SELF-ALIGNED | |
| ALIGNMENT | NATURE OF ALIGNMENT CRITICAL = (C) NONCRITICAL = (NC) | ALIGNMENT | NATURE OF ALIGNMENT: CRITICAL = (C) NONCRITICAL = (NC) |
| ISOLATION-BURIED LAYER | C | 1ST MASTER MASK TO BURIED LAYER | C |
| ISOLATION OVERSIZE TO ISOLATION | NC | ISOLATION OVERSIZE TO 1ST MM | NC |
| BASE TO ISOLATION | C | BASE WASHOUT ELIMINATES BASE OVERSIZE TO 1ST MM | |
| RESISTOR TO BASE | C | RESISTOR TO 1ST MM | C |
| EMITTER TO BASE | C | 2ND MM TO 1ST MM | C |
| PREOHMIC TO BASE | C | EMITTER OVERSIZE TO 2ND MM | NC |
| OVERSIZE PREOHMIC TO PREOHMIC | NC | PREOHMIC OVERSIZE TO 2ND MM | NC |
| METAL TO PREOHMIC | C | METAL TO 2ND MM | C |

TABLE I-continued
COMPARISON OF ALIGNMENT STEPS

| CONVENTIONAL | | SELF-ALIGNED | |
| --- | --- | --- | --- |
| ALIGNMENT | NATURE OF ALIGNMENT CRITICAL = (C) NONCRITICAL = (NC) | ALIGNMENT | NATURE OF ALIGNMENT: CRITICAL = (C) NONCRITICAL = (NC) |
| EMITTER | | | |
| TOTAL 6 CRITICAL ALIGNMENTS AND 2 NONCRITICAL ALIGNMENTS | | TOTAL 4 CRITICAL ALIGNMENTS AND 3 NONCRITICAL ALIGNMENTS | |

What is claimed is:

1. A self-aligned method of manufacturing integrated circuits comprising the steps of:
    a. providing a buried layer and an upper layer over a semiconductor substrate, said upper layer and said buried layer being of a first conductivity type, and said substrate being of a second conductivity type opposite to said first conductivity type;
    b. forming a first masking means over the upper surface of said upper layer, said first masking means having a predetermined pattern of openings formed therein;
    c. forming a first set of semiconductor device regions by selectively applying impurities through said predetermined pattern of openings of said first masking means;
    d. removing said first masking means from said upper surface of said upper layer;
    e. forming a second masking means over the upper surface of said upper layer, said first masking means having a predetermined pattern of openings formed therein; and
    f. forming a second set of semiconductor device regions by selectively applying impurities through said predetermined pattern of openings of said second masking means.

2. The self-aligned method of manufacturing integrated circuits as recited in claim 1 further comprising the step:
    a. forming an additional set of semiconductor device regions by applying impurities through portions of said first masking means not constituted by said predetermined pattern of openings.

3. The self-aligned method of manufacturing integrated circuits recited in claim 2 wherein said first masking means comprises at least two layers which are selectively etchable with respect to each other.

4. The self-aligned method of manufacturing integrated circuits as recited in claim 3 wherein at least one of said layers is silicon dioxide.

5. The self-aligned method of manufacturing integrated circuits as recited in claim 3 wherein at least one of said selectively etchable layers is silicon nitride.

6. The self-aligned method of manufacturing integrated circuits as recited in claim 2 wherein said second masking means comprises at least two layers which are selectively etchable with respect to each other.

7. The self-aligned method of manufacturing integrated circuits as recited in claim 6 wherein at least one of said layers is silicon dioxide.

8. The self-aligned method of manufacturing integrated circuits as recited in claim 6 wherein at least one of said selectively etchable layers is silicon nitride.

9. The self-aligned method of manufacturing integrated circuits as recited in claim 2 wherein said upper layer is an epitaxially deposited silicon layer.

10. The self-aligned method of manufacturing integrated circuits as recited in claim 2 wherein said semiconductor substrate is silicon.

11. The self-aligned method of manufacturing integrated circuits recited in claim 1 wherein said first set of device regions comprise the base region and the isolation region of a semiconductor device.

12. The self-aligned method of manufacturing integrated circuits recited in claim 11 wherein said first set of semiconductor device regions comprise resistor contact regions.

13. The self-aligned method of manufacturing integrated circuits recited in claim 1 wherein said second set of semiconductor device openings comprise the collector contact base contact and emitter regions of a semiconductor device.

14. The self-aligned method of manufacturing integrated circuits recited in claim 2 wherein said step of applying impurities through portions of said first masking means not constituted by said predetermined pattern of openings comprises ion implantation.

15. A self-aligned method of manufacturing integrated circuits comprising the steps of:
    a. providing a buried layer and an upper layer over a semiconductor substrate, said upper layer and said buried layer being of a first conductivity type, and said substrate being of a second conductivity type opposite to said first conductivity type;
    b. depositing a first masking layer over the upper surface of said upper layer;
    c. depositing a second masking layer of the upper surface of said first masking layer;
    d. forming a predetermined pattern of openings in said second layer, said predetermined pattern comprising a first and a second group of openings;
    e. forming a first group of semiconductor device regions by applying impurities through openings etched through said first masking layer using said first group of openings as an etching mask;
    f. forming a second group of semiconductor device regions by applying impurities through openings etched through said first masking layer using said second group of openings as an etching mask;
    g. forming shallow device regions, said shallow device regions overlaying the upper surfaces of said first and said second group of device regions and said shallow device regions being formed irrespective of said predetermined pattern of openings;
    h. removing said first and said second masking layers;
    i. depositing a third masking layer over the upper surface of said upper layer;

j. depositing a fourth masking layer over the upper surface of said third masking layer;
k. forming a predetermined pattern of openings in said fourth layer, said predetermined pattern comprising a third and a fourth group of openings;
l. forming a third group of semiconductor device regions by applying impurities through openings etched through said third masking layer using said third group of openings as an etching mask; and
m. forming a group of contact openings through said third masking layer using said fourth group of openings as an etching mask.

16. A self-aligned method of manufacturing integrated circuits as recited in claim 15 wherein said step of forming a second group of semiconductor device regions includes the reopening of said first group of openings simultaneous with the etching of openings using said second group of openings as an etching mask.

* * * * *